United States Patent [19]

Lawton et al.

[11] Patent Number: 4,580,282
[45] Date of Patent: Apr. 1, 1986

[54] ADJUSTABLE RATIO DIVIDER

[75] Inventors: Rodney J. Lawton; David Sawyer; Peter W. Gaussen, all of Wiltshire, England

[73] Assignee: Plessey Overseas Limited, Ilford, England

[21] Appl. No.: 443,677

[22] Filed: Nov. 22, 1982

[30] Foreign Application Priority Data

Nov. 25, 1981 [GB] United Kingdom ................ 8135486

[51] Int. Cl.$^4$ ............................................ H03K 21/36
[52] U.S. Cl. .................................... 377/110; 377/52
[58] Field of Search ................. 377/110, 118, 47, 48

[56] References Cited

U.S. PATENT DOCUMENTS 4,184,068  1/1980  Washburn ........................... 377/47

FOREIGN PATENT DOCUMENTS

| 148701 | 6/1981 | Fed. Rep. of Germany | 377/47 |
| 798084 | 7/1958 | United Kingdom . |
| 1185037 | 3/1970 | United Kingdom . |
| 1225932 | 3/1971 | United Kingdom . |
| 1277279 | 6/1972 | United Kingdom . |
| 1412779 | 11/1975 | United Kingdom . |
| 1477593 | 6/1977 | United Kingdom . |
| 1487955 | 10/1977 | United Kingdom . |
| 1497479 | 1/1978 | United Kingdom . |
| 2005881A | 4/1979 | United Kingdom . |
| 2008824A | 6/1979 | United Kingdom . |
| 1569944 | 6/1980 | United Kingdom . |
| 2034945A | 6/1980 | United Kingdom . |
| 2049245A | 12/1980 | United Kingdom . |

Primary Examiner—Stanley D. Miller
Assistant Examiner—K. Ohralik
Attorney, Agent, or Firm—Fleit, Jacobson, Cohn & Price

[57] ABSTRACT

An adjustable ratio divider comprises a controllable gate connected in series with a divider for passing a clock signal in pulse form whose frequency is to be divided. A means is provided for controlling the gate to subtract a selectable number (including zero) of clock pulses from the clock signal to control the division ratio of the divider.

13 Claims, 3 Drawing Figures

ADJUSTABLE RATIO DIVIDER

BACKGROUND

This invention relates to an adjustable ratio divider.

Adjustable ratio dividers are commonly used in phase locked loop circuits to divide a signal fed from a controllable oscillator to a phase comparator. Changing the division of the divider changes the frequency of the oscillator and this oscillator provides an output frequency.

It is desirable to produce the phase locked loop circuit in integrated circuit form and in particular as a single chip.

The production of a phase locked loop circuit in a single chip leads to conflicting requirements. It is desirable to keep power consumption in the frequency dividers, particularly the adjustable ratio divider, as low as possible and this means that the dividers should operate at a relatively low frequency.

A relatively low frequency is not, however, ideal for phase comparison and for better acquisition time of the loop and lower ripple in the output frequency, a maximised reference frequency is desired. Also for high frequency operation e.g. a frequency range extending through the loop down from about 1 GH$_z$, the higher frequency portion of the loop must be formed in high frequency logic such as ECL (emitter coupled logic).

ECL logic is not compact compared with a lower frequency logic such as Integrated Injection Logic (I$^2$L) and extensive use of ECL would result in an undesirably large chip.

OBJECTS AND SUMMARY

This invention seeks to provide an adjustable ratio divider suitable for use in a single chip phase locked loop circuit in which the relative proportions of high and low frequency logic are sought to be optimised.

According to one aspect of the invention there is provided an adjustable ratio divider comprising a controllable gate connected in series with divider means for passing a clock signal in pulse form whose frequency is to be divided; and means for controlling the gate to subtract a selectable number (including zero) of clock pulses from the clock signal to control the division ratio of the divider.

In a particularly advantageous refinement of the invention a plurality of controllable gates are employed in a series arrangement, adjacent gates in the series arrangement being separated from one another by divider means; and means for controlling each gate is provided to subtract a selectable number (including zero) of clock pulses from the clock signal to control the division ratio of the divider.

The dividing mean(s) may be a fixed ratio divider.

The means for controlling the gate(s) may comprise means for supplying to each controllable gate, a control signal in pulse form.

The means for supplying a control signal in pulse form may comprise a programmable rate multiplier and in an embodiment of the invention each controllable gate is controlled by a respective rate multiplier. As is described later, the multiplier includes a number of dividers which produce signals to multiply down the control signals.

Each rate multiplier may be independently programmable.

Each rate multiplier may be programmable by a digital code and in an embodiment of the invention the digital code is fed to a programming store associated with the multiplier.

The programming store may be a shift register.

Each rate multiplier may comprise a plurality of dividers, one for of each bit of the digital code, the dividers being clocked in series with one another, and coincidence detection means for providing an output signal when output states of the dividers correspond to states representative of the programmed digital code.

The coincidence detection means may include a coincidence detector associated with each divider, each detector being arranged to provide an output signal when the output state of the associated divider corresponds to a state representative of a respective bit of the programmed digital code.

Each coincidence detector may be formed by gating means and in a preferred embodiment of the invention the gating means is formed in I$^2$L.

Each I$^2$L gating means may include two I$^2$L gates each having an input coupled to a respective one of two complementary outputs of a respective divider and to one of two complementary inputs representative of a bit of the digital code, and an output coupled to the output of the other gate of the two.

A latch may be provided and arranged to be set in response to the dividers having a first predetermined output state, and to be reset in response to the output signal provided by the coincidence detection means.

The latch may have an output coupled to control the supply of a clock signal, which comprises said control signal in pulse form, to a respective controllable gate whereby the clock signal is supplied to the gate during either the set or reset period of the latch.

A plurality of rate multipliers may include a common plurality of dividers clocked in series with one another, and in a preferred embodiment the dividers provide a plurality of sets of parallel outputs, one set for each multiplier of the plurality of multipliers, each multiplier of the plurality including a respective coincidence detection means for providing an output signal, when output states of a respective set of parallel outputs correspond to states representative of the programmed digital code for that multiplier.

BRIEF DESCRIPTION OF THE DRAWINGS

An exemplary embodiment of the invention will now be described with reference to the drawings in which.

DETAILED DESCRIPTION

Figure 1:
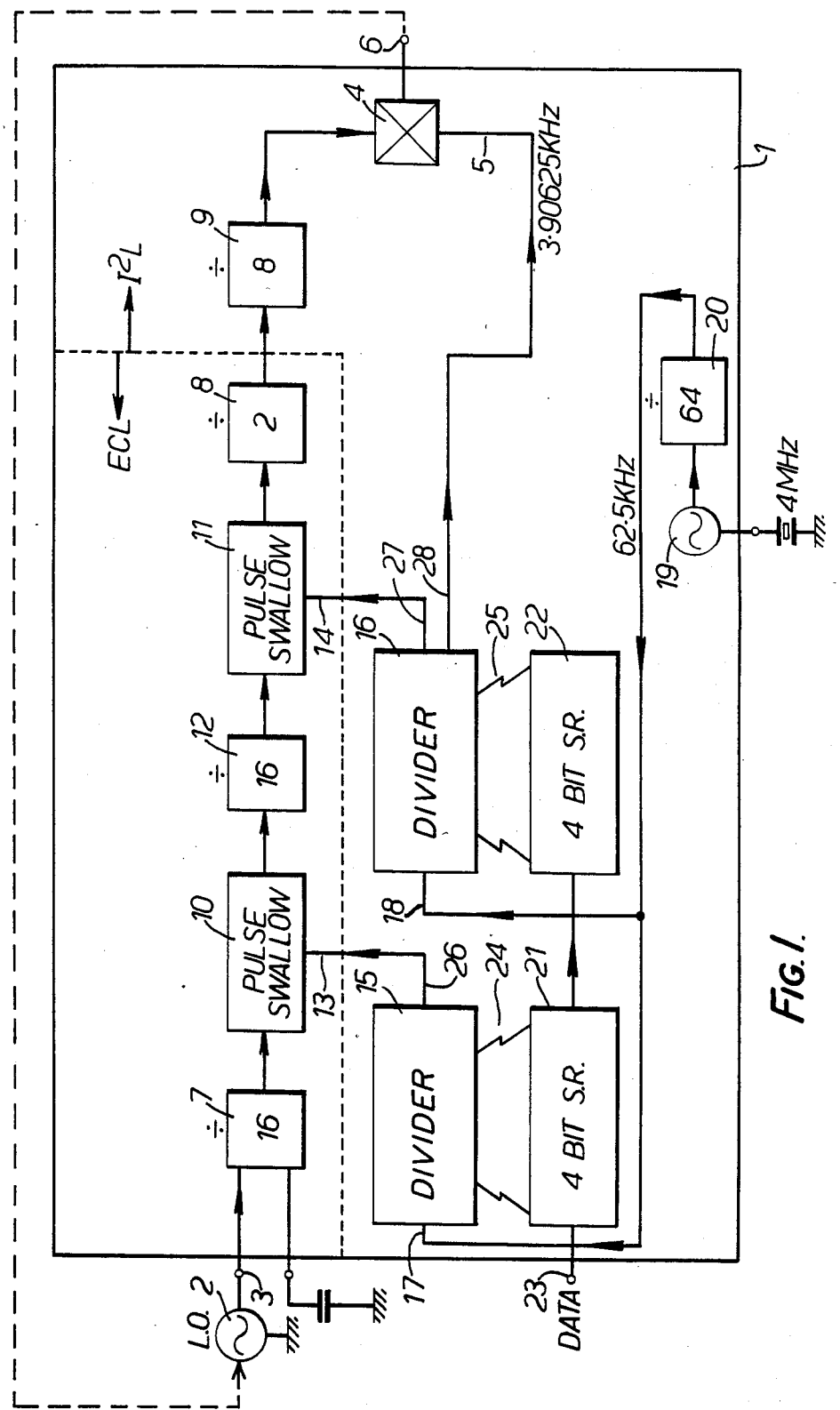
FIG. 1 illustrates a phase locked loop circuit including an adjustable ratio divider in accordance with this invention.

Referring to FIG. 1 a phase locked loop circuit is provided on a single integrated circuit chip referenced 1. A controllable local oscillator 2 is located off chip and provides an output signal which is fed as an input signal to the chip via an input terminal 3. The local oscillator signal presented at the terminal 3 is fed via divider circuits (to be described) to one input of a phase comparator 4, a second input 5 of which receives a reference frequency. An output signal is fed from the phase comparator 4 to a chip output terminal 6 and then as a control signal for the local oscillator 2. The value of this control signal will depend upon the frequency and phase relationship between the signal fed to the comparator 4 from the local oscillator 2 and the reference frequency fed to the input 5.

The divider chain for dividing the signal presented at the terminal 3 comprises a fixed ratio prescaler 7, the adjustable ratio divider of the present invention and finally a further fixed ratio divider 9. The adjustable ratio divider, which is located between the fixed ratio dividers 7 and 9 includes two controllable gates in the form of pulse swallow gates 10 and 11 which are separated by a fixed ratio divider 12. The pulse swallow gates 10 and 11 receive control input signals at control inputs 13 and 14 respectively.

In response to control signals fed to the pulse swallow gates 10 and 11 via the inputs 13 and 14 respectively the gates operate to remove a selectable number (including zero) of pulses fom the signal fed through the gates so that the fixed dividers 12 and 8 divide the signal by a number which is dependent upon the number of pulses removed by each pulse swallow gate.

The control signals fed to the control inputs 13 and 14 of the gates 10 and 11 respectively are derived from programmable four bit rate multipliers 15 and 16 respectively. The four bit rate multipliers 15 and 16 receive clock input signals at inputs 17 and 18 respectively, these clock input signals being fed from a crystal controlled oscillator 19 via a prescaler 20. The rate multipliers 15 and 16 are programmable by means of respective four bit shift registers 21 and 22 which receive programming data in the form of four bit binary codes fed from a data input terminal 23.

In operation a four bit digital code is loaded into each of the shift registers 21 and 22 and as illustrated the shift registers 21 and 22 are connected to be loaded serially from the terminal 23. The shift registers 21 and 22 act as program stores for the rate multipliers 15 and 16 respectively and may be loaded either with the same digital code or may be independently programmable with different codes.

Programming information contained in the shift registers 21 and 22 is communicated to the multipliers 15 and 16 via programming links 24 and 25 respectively. The rate multiplier 15 has an output 26 coupled to the control input 13 of the pulse swallow gate 10 whilst the rate multiplier 16 has an output 27 connected to the control input 14 of the pulse swallow gate 11.

Each rate multiplier 15, 16 has an output cycle which is a fraction of the frequency of the clock input signal and for each output cycle a number of clock pulses are provided at its output in dependence upon the digital code programmed into the associated shift register programming store. In the present embodiment the output cycle of the rate multipliers 15 and 16 is equal to the reference frequency of the phase comparator 4 and consequently the multiplier 16 has an additional reference frequency output 28 which is connected to the reference signal input 5 of the phase comparator 4.

For each pulse fed from the multipliers 15 and 16 to the control signal inputs 13 and 14 of the pulse swallow gates 10 and 11 respectively a pulse is removed from the signal passing through those gates so as to change the effective division ratio of a subsequent fixed ratio divider and the overall division ratio of the adjustable ratio divider.

The structure and operation of the bit rate multipliers 15 and 16 will now be described with reference to FIG. 2 where corresponding parts to those in FIG. 1 bear like reference numbers.

Figure 2:
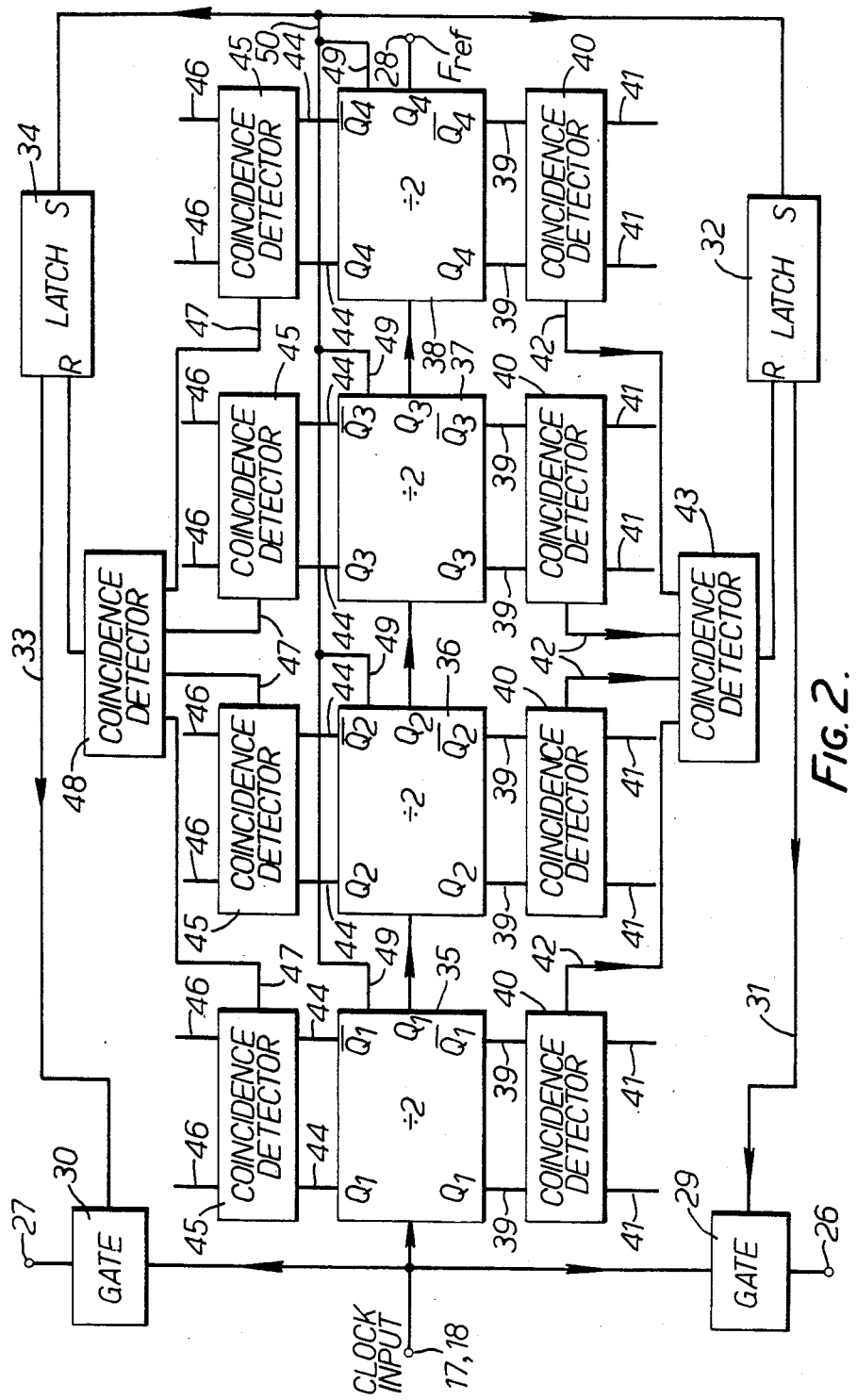
FIG. 2 illustrates in more detail the rate multipliers forming part of the phase loop of FIG. 1 and, FIG. 3 illustrates a coincidence detector forming part of a rate multiplier illustrated in FIG. 2.

Referring now to FIG. 2 clock input signals are fed to the common input terminal 17, 18 then in parallel through output gates 29 and 30 to output terminals 26 and 27 respectively which provide the output terminals of the multipliers 15 and 16 respectively. The gate 29 passes clock signals to the output terminal 26 under the control of a gating signal fed over line 31 from a latch 32 whilst the a latch 34.

The clock input signals are also fed through four series connected binary dividers 35, 36, 37, and 38 to provide the reference frequency output at an output terminal 28. The series connected dividers 35, 36, 37 and 38 are common to both the multipliers 15 and 16. Each divider has a first pair of complementary Q, $\overline{Q}$ outputs 39 connected to a respective coincidence detector 40. The coincidence detectors 40 are exclusive to the rate multiplier 15 and each detector has a second pair of inputs 41 which are set with complementary binary bits in dependence upon the digital code entered into the four bit shift register 21 associated with the multiplier 15.

The coincidence detector 40 associated with the divider 35 is programmed e.g. by means of a latch, from the least significant bit of the binary code entered into the shift register 21 whilst the detector 40 associated with the divider 38 is programmed with the most significant bit. For a particular coincidence detector, if the bit entered into the shift register is a binary 1 then the two input 41 would be set with one at binary 1 and the other at binary 0 and this setting would be reversed for a programmed binary zero. Each coincidence detector 40 has an output 42 connected to a further coincidence detector 43 which provides an output connected to reset the latch 32.

Each of the dividers 35, 36, 37 and 38 has a second pair of complementary Q, $\overline{Q}$ outputs 44 which form part of the second rate multiplier 16 and each pair of outputs 44 is coupled to a respective coincidence detector 45 each of which has a pair of programming inputs 46 which are programmed in dependence upon the digital code entered into the shift register 22 in similar manner to the programming inputs 41 of the coincidence detectors 40. As in the case of the coincidence detectors 40 each coincidence detector 45 has an output 47 connected to a further coincidence detector 48 which provides an output to reset the latch 34.

Each divider 35, 36, 37 and 38 has a further $\overline{Q}$ output 49 all of which are wired together to a common line 50 which is connected to the set inputs of both the latches 32 and 34.

As described FIG. 2 illustrates an embodiment of both the rate multipliers 15 and 16 in which, the dividers 35, 36, 37 and 38 are common to both multipliers whilst each multiplier has its own set of coincidence detectors, latch and gate. Since the operation of both multipliers is identical only the operation of one multiplier, namely the multiplier 15 will be described further.

Since the outputs 49 of the dividers 35, 36, 37 and 38 are wired together the latch 32 will be set when all these outputs are in a predetermined output state for example all at logical 1. When the latch 32 is set the gate 29 will be enabled via the gate control input 32 and clock input signals fed to the terminal 17, 18 will be fed through the gate 29 and appear at the output terminal 26 of the rate multiplier 15. These pulses will then be passed to the pulse swallow gate 10 to control that gate to remove pulses from the frequency divided local oscillator signal fed from the terminal 3.

The clock input signals will also be fed through the series connected dividers 35, 36, 37 and 38 and when the coincidence detector 40 coupled to each divider detects that the outputs 39 match the inputs to the detector programmed at the programming inputs 41, that detector will provide a signal at output 42 indicating coincidence has been achieved. Since the outputs 42 of all the coincidence detectors 40 are connected to a further coincidence detector 43 this detector 43 will only provide an output when coincidence is simultaneously detected by all four coincidence detectors 40. When this occurs the coincidence detector 43 will provide an output signal which will reset the latch 32.

When the latch 32 is reset the gate enabling signal at the control input 31 of the gate 29 will be removed and the gate 29 will be blocked. No further pulses will therefore be fed to the pulse swallow gate 10. The number of pulses passed by the gate 29 will depend upon the period of time for which that gate is enabled and that will depend upon the digital code which is set into the shift register 21 and subsequently transferred into suitable inputs for the coincidence detectors 40.

Figure 3:
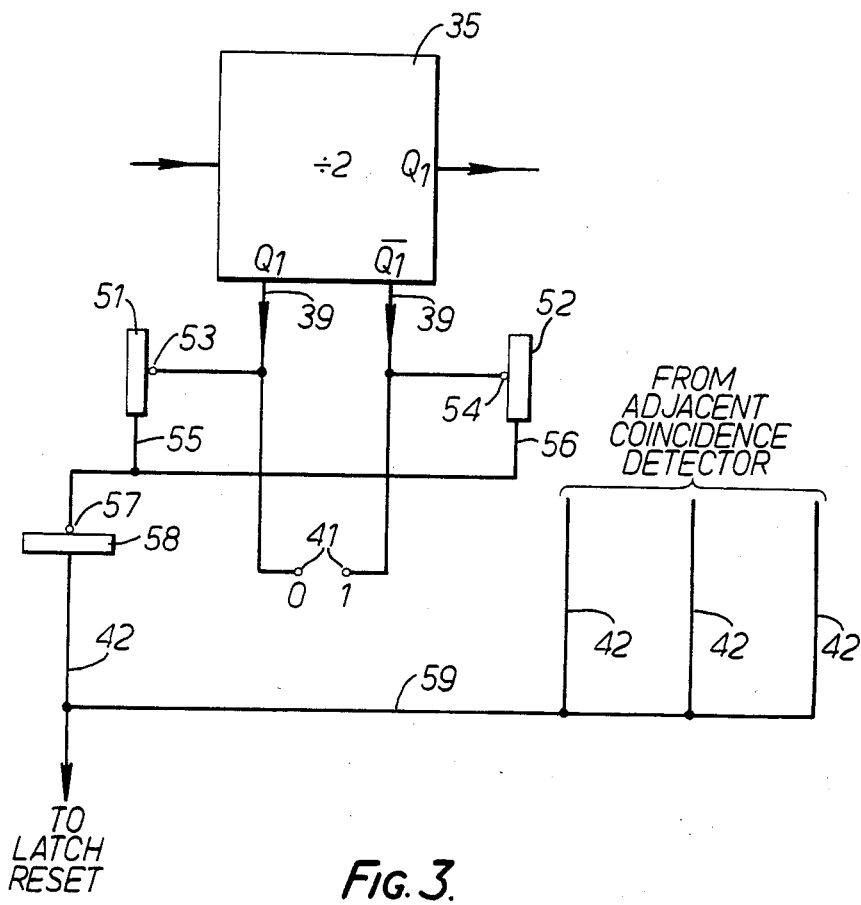

The coincidence detectors 40 and 43 are illustrated in more detail in FIG. 3 where for ease of explanation only a signal detector 40 associated with the divider 35 is illustrated in detail, together with the coincidence detector 43. Each detector 45 is constructed in similar manner to the detectors 40 and the coincidence detector 48 is similar to the detector 43.

Referring now to FIG. 3 a coincidence detector 40 is formed in I²L technology and comprises a pair of I²L gates 51 and 52 having inputs 53 and 54 respectively coupled to respective ones of the complementary outputs 39 of the divider 35. Each of the inputs 53 and 54 is also connected to a respective one of the programming input terminals 41 of the coincidence detector. The gates 51 and 52 have outputs 55 and 56 respectively which are wired together and connected to an input 57 of a further inverting I²L gate 58. The gate 58 has an output 42 which provides the output of the coincidence detector. Assume that the four bit code entered into the shift register 21 is such as to set the terminal 41 which is connected to the gate 51 at logical 0 whilst the other terminal 41 is at logical 1. Coincidence will occur when the Q1 output 39 is at logical 0 whilst the $\overline{Q1}$ output 39 is at logical 1. The input 53 to the gate 51 will therefore be at logical 0 whilst the input 54 of the gate 52 will be at logical 1. The output 55 of the gate 51 will be set at logical 1 whilst the output 56 of the gate 52 will be at logical 0 and since these outputs are wired together the input 57 to the gate 58 will be held at logical 0. This logical 0 input signal will be inverted by the gate 58 and fed as a logical 1 to the coincidence detector 43.

The coincidence detector 43 effectively comprises a wired connection 59 between the outputs 42 of all the coincidence detectors 40 and this wired connection is coupled to the reset input of the latch 32. When all the coincidence detectors 40 indicate coincidence then all of the outputs 42 will carry a logical 1 and consequently a logical 1 will be fed to the latch 32. In the absence of coincidence i.e. when in the above example the Q1 output 39 is at logical 1 whilst the $\overline{Q1}$ output is at logical 0, the input to both the gates 51 and 52 will be held at logical 0 and the output of both gates will therefore be at logical 1. This will be inverted by the inverting gate 58 to provide a logical 0 signal at the output 42. Consequently if any coincidence detector 40 fails to detect coincidence, the logical 0 present at one output 42 will hold the whole wired connection 59 at the logical 0 level.

The use of a plurality of pulse swallow gates in which adjacent ones being separated from one another by a fixed divider allows all the control circuitry for these gates to be fabricated in relatively low speed logic such as I²L. Only the gates themselves and higher operating frequency fixed dividers require to be fabricated in high speed logic such as ECL. In FIG. 1 this division between ECL and I²L is indicated by a dashed line. By maximising the proportion of I²L to that of ECL enables a much more compact chip to be obtained whilst allowing the use of a relatively high reference frequency. By way of example typical values for frequencies occurring at various points in the arrangement of FIG. 1 are indicated. In particular the oscillator 19 operates at 4 MHz, the clock input signals fed to the rate multipliers have a frequency of 62.5 KHz whilst the reference frequency is 3.90625 KHz. These values are of course given by way of example only and any suitable values may be used.

I²L logic is particularly suitable for forming the low frequency portions of the circuit since its inherent ability to provide multiple outputs from I²L gates allows the dividers 35 to 38 to be easily provided with the necessary multiple outputs to enable a single divider chain to be common to a plurality of rate multipliers. This further contributes to the production of a compact chip.

The invention has been described by way of example only and modifications may be made without departing from the scope of the invention. For example although two pulse swallow gates have been utilized, a single gate or more than two gates can be provided if required. Also although the rate multipliers are four bit devices the number of bits is a matter of choice. The multipliers have been described as being programmed from program stores provided in the form shift registers but any suitable program store may be used. Also it is not essential that data be fed to the shift registers in serial form and if desired data may be fed to the shift registers in parallel. Whilst the two rate multipliers 15 and 16 have been described as being conveniently fabricated with parts common to both, they can of course be constructed as discrete items if desired.

We claim:

1. A phase locked loop circuit comprising a pulse swallowing gate means for receiving a pulse train and removing a number of pulses therefrom in dependence upon a control signal, said pulse swallowing gate means producing a gated pulse train, a programmable frequency divider means for receiving a clock signal from a clock signal generator and for generating said control signal and a reference signal, and a phase comparator means for generating a second control signal in dependence upon the phase difference between the reference signal and said gated pulse train, said second control signal being fed to a voltage controlled oscillator means for generating and controlling the frequency of said pulse train in response to said second control signal.

2. A phase locked loop circuit according to claim 1, wherein a second pulse swallowing gate, for receiving a signal dependent upon the gated pulse train and removing a number of pulses therefrom in dependence upon a third control signal, is coupled between the first pulse swallowing gate and the phase comparator.

3. A phase locked loop circuit according to claim 2, wherein the third control signal is generated by a second programmable frequency divider, which divider receives a clock signal from the clock signal generator.

4. A phase locked loop circuit according to claim 3, wherein a first frequency dividing means is coupled between the voltage controlled oscillator and the first pulse swallowing gate, which dividing means generates the pulse train received by the first pulse swallowing gate in response to a signal supplied by the voltage controlled oscillator.

5. A phase locked loop circuit according to claim 4, wherein a second frequency dividing means is coupled between the first and the second pulse swallowing gates, the second frequency dividing means being arranged to frequency divide the gated pulse train to generate the signal received by the second pulse swallowing gate.

6. A phase locked loop circuit according to claim 5, wherein a third frequency dividing means is coupled between the second pulse swallowing gate and the phase comparator.

7. A phase locked loop circuit according to claim 1, wherein the clock signal generator comprises a crystal controlled oscillator and a frequency divider.

8. A phase locked circuit according to claim 1, wherein the programmable frequency divider comprises a shift register and a bit rate divider.

9. A frequency synthesizer including a phase locked loop as claimed in claim 1.

10. A phase locked loop circuit according to claim 4, wherein the first frequency dividing means is a fixed ratio divider.

11. A phase locked loop circuit according to claim 5, wherein the second frequency dividing means is a fixed ratio divider.

12. A phase locked loop circuit according to claim 6, wherein the third frequency dividing means is a fixed ratio divider.

13. A phase locked loop circuit according to claim 3, wherein the second programmable frequency divider comprises a shift register and a bit rate divider.

* * * * *